(12) United States Patent
Kato et al.

(10) Patent No.: US 8,257,495 B2
(45) Date of Patent: Sep. 4, 2012

(54) CRUCIBLE HOLDING MEMBER AND METHOD FOR PRODUCING THE SAME

(75) Inventors: Hideki Kato, Gifu (JP); Haruhide Shikano, Gifu (JP); Masahiro Yasuda, Gifu (JP)

(73) Assignee: Ibiden Co., Ltd., Ogaki-Shi (JP)

( * ) Notice: Subject to any disclaimer, the term of this patent is extended or adjusted under 35 U.S.C. 154(b) by 749 days.

(21) Appl. No.: 12/484,883

(22) Filed: Jun. 15, 2009

(65) Prior Publication Data

US 2009/0308306 A1 Dec. 17, 2009

(30) Foreign Application Priority Data

Jun. 17, 2008 (JP) .................................. 2008-158425

(51) Int. Cl.
*C30B 35/00* (2006.01)
(52) U.S. Cl. ...................... 117/200; 117/213; 427/376.2; 65/442
(58) Field of Classification Search .................. 117/200, 117/213; 427/376.2; 65/442
See application file for complete search history.

(56) References Cited

U.S. PATENT DOCUMENTS

| | | | |
|---|---|---|---|
| 6,136,094 A | 10/2000 | Yamaji et al. | |
| 2002/0185061 A1* | 12/2002 | Yamaji et al. | 117/213 |
| 2004/0211354 A1 | 10/2004 | Guirman et al. | |

FOREIGN PATENT DOCUMENTS

| | | | | |
|---|---|---|---|---|
| JP | 09286689 A | * | 11/1997 | |
| JP | 10101471 A | * | 4/1998 | |
| JP | 10-152391 | | 6/1998 | |
| JP | 10152391 A | * | 6/1998 | |
| JP | 10-245275 | | 9/1998 | |
| JP | 11-060373 | | 3/1999 | |
| JP | 11060373 A | * | 3/1999 | |
| JP | 11255587 A | * | 9/1999 | |

OTHER PUBLICATIONS

U.S. Appl. No. 12/431,223.
U.S. Appl. No. 12/432,813.
U.S. Appl. No. 12/468,990.
U.S. Appl. No. 12/392,898.
U.S. Appl. No. 12/392,859.
U.S. Appl. No. 12/389,345.
Extended European Search Report for corresponding EP Application No. 09007868.4-1215, Oct. 19, 2010.

* cited by examiner

*Primary Examiner* — Matthew Song
(74) *Attorney, Agent, or Firm* — Ditthavong Mori & Steiner, P.C.

(57) ABSTRACT

A crucible holding member includes a mesh body having an axis direction. The mesh body includes a hollow, an opening, and a plurality of strands. The hollow is provided inside the opening. The opening faces toward one end of the axis direction. The plurality of strands include a plurality of carbon fibers and are woven diagonally with respect to the axis direction to provide the hollow and the opening. The plurality of strands are folded inwardly or outwardly at an edge of the opening, thereby providing a two-layered portion along the edge of the opening. A matrix is filled between the plurality of carbon fibers of the mesh body.

14 Claims, 8 Drawing Sheets

CRUCIBLE HOLDING MEMBER AND METHOD FOR PRODUCING THE SAME

CROSS-REFERENCE TO RELATED APPLICATION

This application claims priority under 35 U.S.C. §119 to Japanese Patent Application No. 2008-158425, filed on Jun. 17, 2008. The contents of this application are incorporated herein by reference in their entirety.

BACKGROUND OF THE INVENTION

1. Field of the Invention

The present invention relates to a crucible holding member and a method for producing the crucible holding member.

2. Description of the Related Art

A carbon material has heretofore been heavily used in a silicon single crystal pulling-up apparatus, for the reasons that the carbon material has high heat resistance and high thermal shock properties, and that the carbon material hardly contaminates silicon. In particular, an isotropic graphite material is hard to react with a reactive gas such as SiO generated in the apparatus due to its high density, and the reaction rate of the isotropic graphite material with $SiO_2$ as a material for a quartz crucible for containing a silicon melt is small. Accordingly, the graphite member has been widely used as a crucible holding member for holding the periphery of the quartz crucible.

In recent years, an increase in diameter of a silicon wafer has progressed in order to increase yield and improve productivity, and a 300-mm wafer has been becoming mainstream. The development of a wafer further increased in diameter exceeding 400 mm has also been advanced. With this increase in diameter of the silicon wafer, the seize of the silicon single crystal pulling-up apparatus becomes large, so that the weight of a crucible holding member used in the apparatus becomes extremely heavy, resulting in the difficulty of handling such as setting to the apparatus.

Further, a production process of the isotropic graphite material requires a press process under hydrostatic pressure, and requires a Cold Isostatic Press (CIP) apparatus having a size of about 1.5 times the diameter of the graphite product. The diameter of the conventional CIP apparatus is not enough for the isotropic graphite material as a large-size crucible holding member, so that a larger apparatus becomes necessary.

As a technique for producing the large-size graphite crucible holding member without using the CIP apparatus, there has been proposed a technique including forming carbon fibers into a specified form by a filament winding process, impregnating it with a resin or pitch as a matrix, and burning it to produce a crucible holding member made of a carbon/carbon fiber composite (hereinafter referred to as a C/C composite) (for example, see JP-A-10-152391 or JP-A-11-60373), and a technique including adhering carbon fiber cloth to a forming die, performing molding and curing to obtain a carbon fiber-reinforced plastic, and then, impregnating and burning it to produce a crucible holding member made of a C/C composite (for example, see JP-A-10-245275), or the like.

In the meantime, in the silicon single crystal pulling-up apparatus, a single crystal ingot is produced while melting silicon, so that it is necessary to heat the inside of the apparatus to a temperature equal to or higher than the melting point (1,420° C.) of silicon. When silicon is melted, the crucible holding member and the quartz crucible inserted therein are softened to adhere to each other. The coefficient of thermal expansion of quartz glass is $0.6 \times 10^{-6}$/° C., and that of the C/C composite is generally equivalent thereto. Accordingly, when the apparatus is cooled after the silicon melt has been almost removed after completion of pulling-up of the single crystal ingot, both are cooled without being strongly restricted with each other.

However, when the silicon melt coagulates by a trouble such as a power failure immediately after the pulling-up is initiated, silicon has the property of expanding (a volume expansion of about 9.6%) with coagulation. Accordingly, this acts as the function of enlarging the quartz crucible and the crucible holding member.

In the case of the apparatus for pulling up a small-diameter single crystal ingot, even when such a trouble occurs, cooling is performed for a short period of time, and moreover, the amount of the non-coagulated melt leaked out is small. However, in the case of the apparatus for pulling up a large-diameter single crystal ingot, when such a trouble occurs, it takes time for cooling, and once the melt start to be leaked out, a large amount of the melt flows out to a bottom portion of the apparatus, which causes significant damage.

The crucible holding member made of the C/C composite produced by using the filament winding process as described in the above-mentioned publication JP-A-10-152391 or JP-A-11-60373 has extremely high strength because of existence of a large number of carbon fibers wound in a direction parallel to a circumferential direction thereof, so that this crucible holding member is suitable for a large-size crucible holding member. However, when the above-described trouble occurs, the carbon fibers aligned in the circumferential direction of the crucible holder member are pulled by very large force caused by expansion of the silicon melt at the time of its coagulation. Accordingly, the carbon fibers would break to cause damage to the crucible holding member.

Further, also in the crucible holding member produced by adhering the carbon fiber cloth as described in the Publication JP-A-10-245275, a large number of carbon fibers aligned in the circumferential direction exist. Accordingly, the crucible holding member would be damaged by tension applied in the circumferential direction, similarly to the above.

Furthermore, in a production process of the crucible holding member made of the C/C composite described in the above-mentioned publications, the carbon fibers are wound on or the carbon fiber cloth is adhered to the forming die to form a shape, a matrix precursor such as a resin is impregnated in the carbon fibers or the carbon fiber cloth, and heat curing and burning carbonization are performed together with the forming die, followed by releasing from the forming die. In these steps, strong tension is also applied to the carbon fibers due to the difference in the thermal expansion coefficient between the forming die and the crucible holding member made of the C/C composite, which may cause the breakage of the carbon fibers.

In addition, although the C/C composite is a material having excellent strength, it has a structural limit in the requirement for obtaining higher strength because the related-art crucible holding member made of the C/C composite has a monolayer structure. The quartz crucible keeps on increasing the size thereof, and with the increase in size, it is expected that very large force comes to act on the crucible holding member. For this reason, further improvement in strength has been desired for the crucible holding member. Further, since the related-art crucible holding member made of the C/C composite has the monolayer structure, an end of the carbon fiber or carbon fiber cloth becomes a broken end at a periphery of an opening portion to cause fraying, resulting in a significant decrease in strength of the opening portion.

Such disadvantages are not limited to the crucible holding member for the silicon single crystal pulling-up apparatus, but similar problems occur in the above-mentioned various fields in which a member contains a container different therefrom in the thermal expansion coefficient in the inside thereof. It has therefore been desired to develop a crucible holding member having sufficient strength to support a container having heavy weight and suppressing occurrence of cracks and the like even when tension occurs in the circumferential direction.

SUMMARY OF THE INVENTION

According to one aspect of the present invention, a crucible holding member includes a mesh body having an axis direction. The mesh body includes a hollow, an opening, and a plurality of strands. The hollow is provided inside the opening. The opening faces toward one end of the axis direction. The plurality of strands include a plurality of carbon fibers and are woven diagonally with respect to the axis direction to provide the hollow and the opening. The plurality of strands are folded inwardly or outwardly at an edge of the opening, thereby providing a two-layered portion along the edge of the opening. A matrix is filled between the plurality of carbon fibers of the mesh body.

According to another aspect of the present invention, a method for producing a crucible holding member includes providing a mesh body precursor which has an axis direction and includes a spheroidal shape and a plurality of strands. The spheroidal shape has a major axis along the axis direction, a circumferential portion orthogonal to the major axis to define a first semispherical portion and a second semispherical portion, and a hollow provided inside the spheroidal shape. The plurality of strands include a plurality of carbon fibers and are woven diagonally with respect to the axis direction to form the first semispherical portion and the second semispherical portion. The first semispherical portion is folded into the second semispherical portion at the circumferential portion to form an opening of a mesh body, whereby the opening has an edge along which a two-layered portion is provided. A matrix is filled between the carbon fibers.

BRIEF DESCRIPTION OF THE DRAWINGS

The above and other aspects of the present invention will become more apparent and more readily appreciated from the following description of exemplary embodiments of the present invention taken in conjunction with the attached drawings, in which.

DETAILED DESCRIPTION

Exemplary embodiments of crucible holding members and methods for producing the same according to the present invention will be described with reference to the accompanying drawings.

Figure 1:
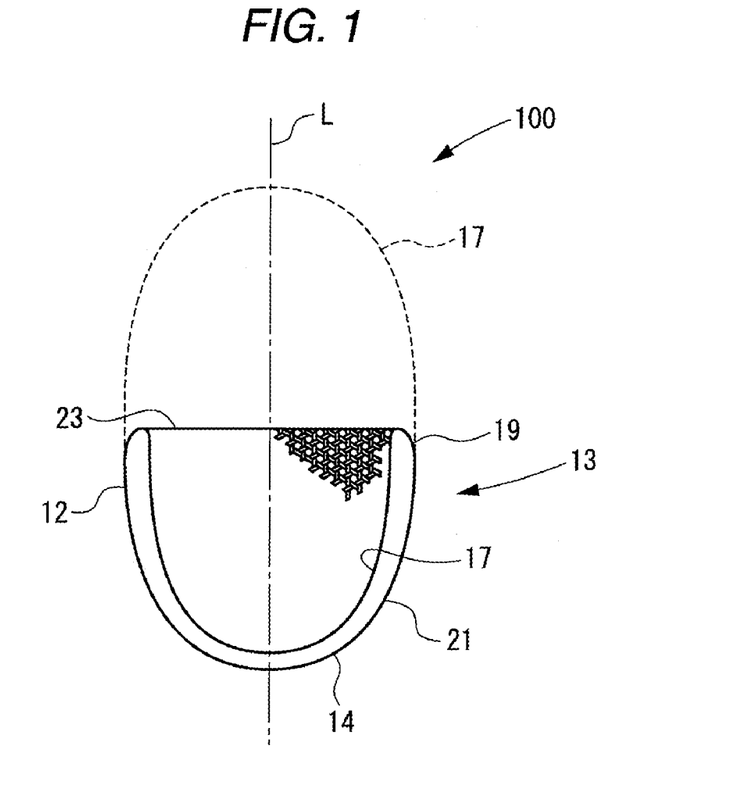
FIG. 1 is a cross-sectional view showing a mesh body of a crucible holding member according to an embodiment of the present invention.
Figure 2:
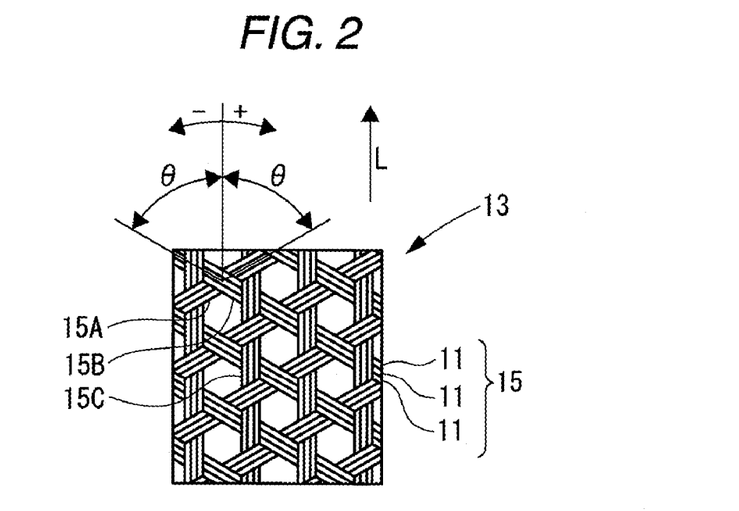
FIG. 2 is an enlarged front view showing a part of the mesh body shown in FIG. 1.

FIG. 1 is a cross-sectional view showing a mesh body constituting a crucible holding member according to an embodiment of the present invention, and FIG. 2 is an enlarged front view showing a part of the mesh body shown in FIG. 1. The crucible holding member 100 according to this embodiment includes a mesh body 13 formed of carbon fibers 11 and a matrix filled in the interstices between the carbon fibers 11 of the mesh body 13. The mesh body 13 has substantially basket-like form having a closed-end. Specifically, the mesh body 13 includes a substantially cylindrical body portion 12 and a bowl-shaped bottom portion 14. This mesh body 13 is formed by triaxial weaving, using as ribbon-like strands 15 each obtained by bundling the plurality of carbon fibers 11 as plaited threads. That is, the mesh body 13 has a triaxial weave structure including first strands 15A aligned at an angle of inclination of +θ (0<θ<90) with respect to an axis line L of the mesh body 13, second strands 15B aligned at an angle of inclination of −θ, and longitudinal strands 15C aligned in the same plane as (along) the axis line L. In other words, the first strands 15A are aligned in a first direction at a first angle with respect to the axis line L, the second strands 15B are aligned at a second angle same as the first angle with respect to the axis line L and the first direction is opposite to the second direction with respect to the axis line L.

Incidentally, in the above-described configuration, the first strands 15A and the second strands 15B are aligned in the opposite direction to each other at the same angle of inclination to the axis line L of the mesh body 13. In the present invention, however, it is not always necessary to be aligned at the same angle. However, alignment of the first strands 15A and the second strands 15B at the same angle of inclination makes the production easy, and mechanical strength balance is easily obtained at the same time.

This mesh body 13 can secure high strength because the first strands 15A and the second strands 15B are braided with each other in a braid shape, and can firmly hold a container. Moreover, the first strands 15A and the second strands 15B are aligned diagonally with respect to the axis line L of the mesh body 13, and not aligned in a direction perpendicular to the central axis (That is, in the circumferential direction of the mesh body 13), so that there is obtained a structure in which the rigidity in the circumferential direction is low. For this reason, even when such force that expands in the circumferential direction acts on the crucible holding member 100 due to some kind of cause, rhomboid-shaped lattices formed by the first strands 15A and the second strands 15B are distorted, whereby the mesh body 13 can be enlarged in the circumferential direction to be capable of absorbing expansion in the circumferential direction. Accordingly, the breakage of the carbon fibers is not likely to occur, and the shape is not largely lost, so that the crucible holding member is excellent in shape stability.

Further, in the mesh body 13, the angle of inclination θ of the first strands 15A and the second strands 15B with respect to the axis line L can be appropriately changed, depending on the rigidity required for each part (position) of the crucible holding member 100. The rigidity in the circumferential direction of the mesh body 13 can be adjusted by changing the angle of inclination θ, so that the rigidity in the circumferential direction can be changed depending on the usage or according to each part (position) of the mesh body 13.

The mesh body 13 has the longitudinal strands 15C aligned in the direction parallel to (along) the axis line L (woven in the same plane as the axis line L). The mesh body has the longitudinal strands 15C. Therefore, a plurality of aggregates of triangle mesh faces are formed, each of which is formed by each one of the strands 15A, 15B and 15C to increase the withstand load in the vertical direction of the mesh body 13 (that is, the strength for carrying the crucible). Accordingly, a quartz crucible having heavy weight can be more securely held, thereby being able to provide the crucible holding member 100 suitable for a large-size silicon single crystal pulling-up apparatus.

The strands 15 are each formed by bundling about tens of thousands of carbon fibers 11. As the carbon fibers 11 constituting the strands 15, there can be used pitch-based carbon fibers, PAN-based carbon fibers or the like. The carbon fibers 11 constituting the first strands 15A, the second strands 15B and the longitudinal strands 15C may be the same material or different materials.

The shape of the strands 15 may be a rod form or the like, as well as a ribbon form. Further, if strands subjected to sizing treatment by impregnating them with an epoxy resin or the like are used as the strands 15, appropriate elasticity is obtained to cause easy weaving in an equal cycle even in manual weaving the strands.

A matrix precursor for coating the mesh body 13 may be any, as long as it can form a carbonaceous or graphitic matrix by burning. As the matrix precursor carbonized or graphitized by burning, there can be used pitch obtained from petroleum, coal or the like, as well as a thermosetting resin having a high carbonization yield such as a COPNA resin, a phenol resin, a furan resin or a polyimide resin. Further, the matrix can also be formed by Chemical Vapor Impregnation (CVI) of pyrolytic carbon, SiC or the like.

In the crucible holding member 100 according to this embodiment, one (an upper) side 17 in an axis line direction of the mesh body 13 is turned inwardly or outwardly (inwardly in the drawing) at a circumferential portion 19 to overlap the one side 17 on the other (a lower) side 21 thereof, thereby forming a two-layer opening portion 23. That is, the mesh body 13 is first formed into a spheroidal shape, and then, inwardly folded (turned) in half at the central circumferential portion 19 along a major axis as the axis line L to overlap the one side 17 on the other side 21. The bowl-shaped mesh body 13 having an endless two-layer structure can be prepared simply, and moreover, with a high degree of accuracy, compared to the case where two mesh bodies separately prepared are overlapped each other. This makes it possible to increase the strength of the whole mesh body, and particularly, to form the high-strength opening portion 23 which causes no fraying. Herein, an original shape of the mesh body 13 can be any, as long as mesh body 13 is to be formed into the bowl shape having the endless two-layer structure, and the original shape before overlapped is not limited to the spheroidal shape. That is, the original shape of the mesh body 13 before overlapped may be a spherical shape, a cylindrical shape with both ends closed by parallel bottom faces or a cylindrical shape with both ends closed by semispherical bottom faces, and further, may be a cylindrical shape with an end opened, as described later.

Figure 3:
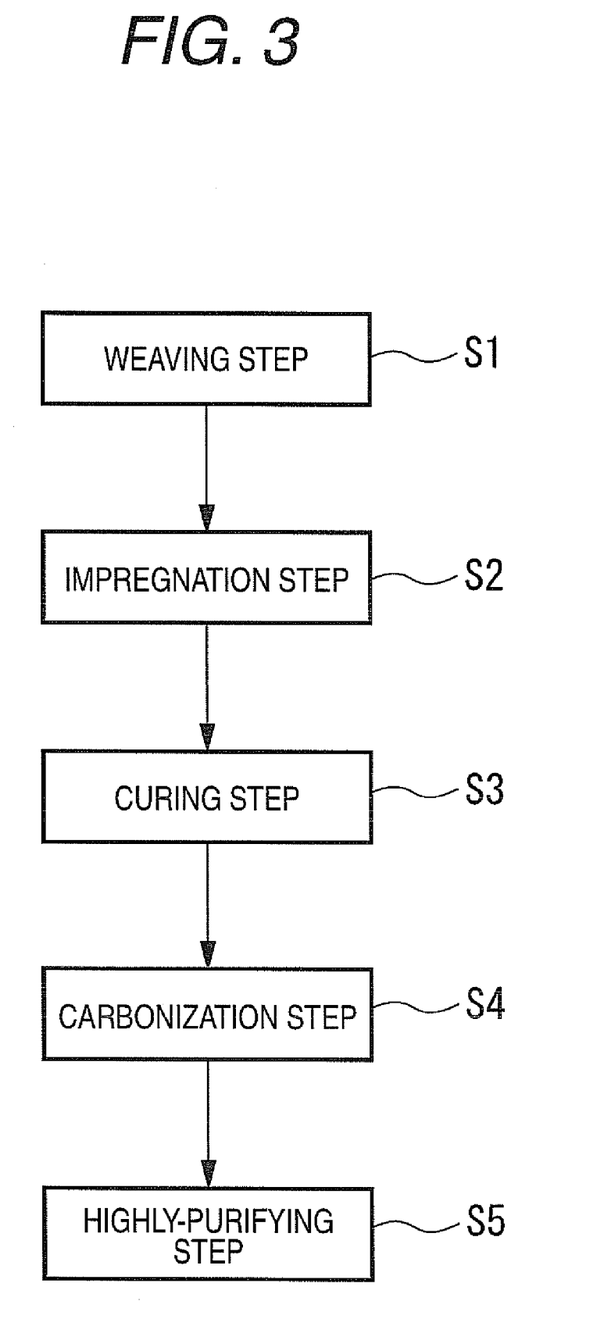
FIG. 3 is a flow chart showing a procedure of a production method according to an embodiment of the present invention.

One example of a method for producing the crucible holding member according to this embodiment will be described below with reference to FIGS. 3 and 4. FIG. 3 is a flow chart showing a procedure of a production method according to the embodiment, and FIG. 4 is a schematic view showing the procedure of the production method according the embodiment.

The crucible holding member 100 according to this embodiment can be produced mainly by the following five steps: namely, a weaving step S1, an impregnation step S2, a curing step S3, a carbonization step S4 and a highly-purifying step S5.

A) Weaving Step S1

Figure 4A:
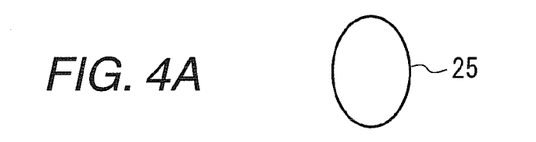
FIGS. 4A to 4H are schematic views showing a procedure of a production method according to an embodiment of the present invention.

First, a spheroid-shaped forming die (core) 25 for forming the triaxial weave mesh body 13 (FIG. 1) as shown in FIG. 4A is prepared. Although the material for the core 25 is not particularly limited, a core which is easily removed in a later removal step is preferably used. The core 25 may be an elastic sheet formed into a bag shape, in which compressed air is sealed, as well as a formed article of a material having good forming/destructing properties such as graphite or sand. If the large-size mesh body is to be formed, the large-size core 25 may be formed by combining a plurality of graphite material pieces by means of an adhesive or the like. Further, if a hollow core 25 is used, it is light in weight, and easy to handle and remove.

Figure 4B:
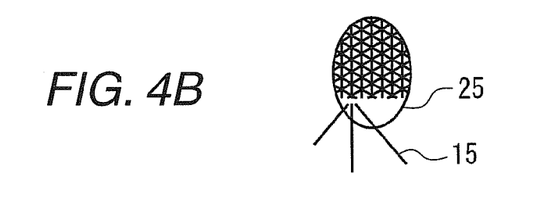

After the core 25 is prepared, ribbon-like strands 15 are each formed by bundling a plurality of carbon fibers, and the strands 15 are woven along an outer periphery of the core 25 by a three-dimensional braiding method, as shown in FIG. 4B, thereby forming the mesh body 13. The formation of the mesh body 13 by the three-dimensional braiding method can be performed by a known method.

A commercially available automatic loom (for example, TWM-32C, TRI-AX, manufactured by Howa Machinery, Ltd.) can be utilized for weaving the strands 15. When the automatic loom is hard to obtain in markets, the mesh body 13 can be manually formed just like the formation of braid.

Further, the mesh body 13 may be produced by preparing a triaxial fabric in which the strands 15 are woven in a planar shape, rounding it into a cylindrical shape around the core 25 and bonding it with an adhesive or the like to form the body portion 12 of the mesh body 13, and further, adhering thereto the bottom portion 14 produced by the three-dimensional braiding method.

Figure 4C:
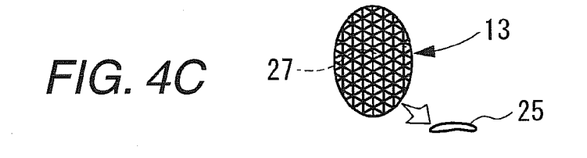

After the mesh body 13 covers the core 25, the core 25 is destructed and removed to form a hollow space 27 as shown in FIG. 4C. In this case, the core 25 is destructed to such a size as to be taken out from the mesh body 13. In this embodiment, the elastic sheet material after discharge of the compressed air is taken out. The core 25 is removed through a nonwoven portion or meshes, thereby becoming possible to prepare the spheroid-shaped mesh body 13 having the hollow space 27 easily and with a high degree of accuracy.

Figure 4D:
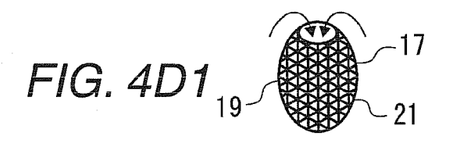
Figure 4D:
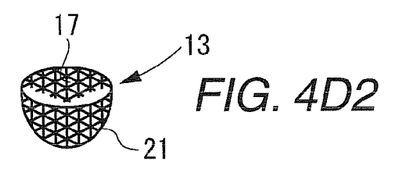

Then, as shown in FIGS. 4D1 and 4D2, the mesh body is inwardly folded in half at a central circumferential portion 19 of the mesh body 13 along the major axis to overlap the one side 17 on the other side 21. Accordingly, the bowl-shaped mesh body 13 having the endless two-layer structure is formed in which a pair of bowl-shaped mesh bodies formed into the same shape symmetrically with respect to the minor axis are overlapped each other inside and outside.

If the mesh body 13 is prepared using the strands 15 subjected to sizing treatment using an epoxy resin or the like in large amount, which causes the difficulty of impregnation of a resin as a matrix precursor in the subsequent step, defatting treatment may be conducted after the formation of the mesh body in order to remove the sizing material such as the epoxy resin. The defatting treatment is usually performed by heating at about 150 to 400° C. under a nonoxidative atmosphere. It is advantageous that this defatting treatment is conducted only when the strands 15 subjected to the sizing treatment using the epoxy resin or the like in large amount are used.

B) Impregnation Step S2

Figure 4E:
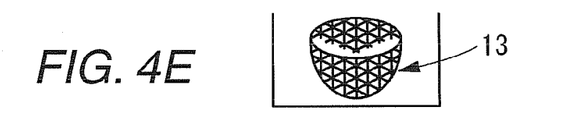

As shown in FIG. 4E, the mesh body 13 formed in the weaving step S1 is immersed in the uncured matrix precursor including a resin composition or the like to form an original material in which the mesh body 13 is impregnated with the matrix precursor.

The impregnation may be performed either at normal pressure or under increased pressure. If the carbon fibers are thin and wettability with the matrix precursor to be impregnated is poor, the impregnation under increased pressure is effective. Further, if the matrix precursor has sufficient wettability with the carbon fibers, the matrix precursor can be sufficiently impregnated in the strands only by coating or spraying.

In addition, if vacuuming is performed before the impregnation, voids are not likely to remain in the strands 15. Accordingly, the homogeneous original material can be obtained.

C) Curing Step S3

Figure 4F:
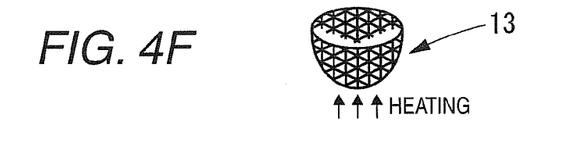

Then, as shown in FIG. 4F, the mesh body (original material) 13 impregnated with the matrix precursor is heated to be cured. Although the curing temperature can be appropriately set depending on the kind of matrix precursor and the like, it is set at a temperature at which gelation reaction associated with the curing severely occurs (roughly about 100° C. to 150° C.). It may be important to slow down the increase rate of temperature in the vicinity of a predetermined temperature to sufficiently vent a generated gas so as to make it possible to sufficiently diffuse the gas.

D) Carbonization Step S4

Figure 4G:
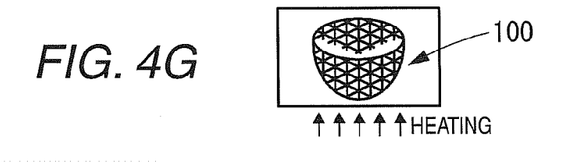

As shown in FIG. 4G, organic materials contained in the original material obtained in the curing step S3 are carbonized to obtain a crucible holding member 100 mainly composed of carbon. The treatment temperature in the carbonization step is preferably at least about 600° C. (a temperature at which the discharge of the organic gas starts to subside), and more preferably 900° C. (a temperature at which contraction in size and gas generation subside) or higher.

E) Highly-Purifying Step S5

Figure 4H:
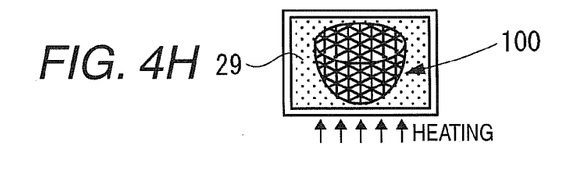

As shown in FIG. 4H, the crucible holding member 100 obtained by the method of the carbonization step S4 is subjected to highly-purifying treatment to remove impurities. The highly-purifying treatment can be performed by a known method. Specifically, it can be performed by heat treatment in an atmosphere gas 29 such as a halogen gas or a halogenated hydrocarbon at 1,500° C. to 3,000° C. for 1 hour or more.

In the above-described production example, the mesh body 13 is impregnated with the matrix precursor after the preparation thereof. However, the strands 15 are previously impregnated with the matrix precursor, and the mesh body 13 can also be woven using the strands 15 impregnated with the matrix precursor. That is, the crucible holding member can also be produced in the order of the impregnation step S2, the weaving step S1, the curing step S3, the carbonization step S4 and the highly-purifying step S5. In any order, it is preferred that the curing step S3 is performed after the impregnation step S2 and the weaving step S1, because the matrix adhered to surfaces of the strands 15 acts as an adhesive among the strands.

As the adhesive, there can be used pitch obtained from petroleum, coal or the like, as well as a thermosetting resin having a high carbonization yield such as a COPNA resin, a phenol resin, a furan resin or a polyimide resin. It may be allowed to act as a matrix adhesive adhered to the surfaces of the strands, or may be newly applied at the time of turning back.

According to this method for producing the crucible holding member 100, the strands 15 are diagonally woven to form the hollow mesh body 13, and the mesh body 13 is inwardly folded at half to overlap the one side 17 of the mesh body 13 on the other side 21 thereof. Accordingly, the crucible holding member 100 of the endless two-layer structure which is high in strength and stable in shape against tension in the circumferential direction and moreover in which the fraying of the opening portion 23 is suppressed can be produced by a simple process, easily and with a high degree of accuracy, compared to the case where two mesh bodies are prepared and overlapped each other.

Figure 5:
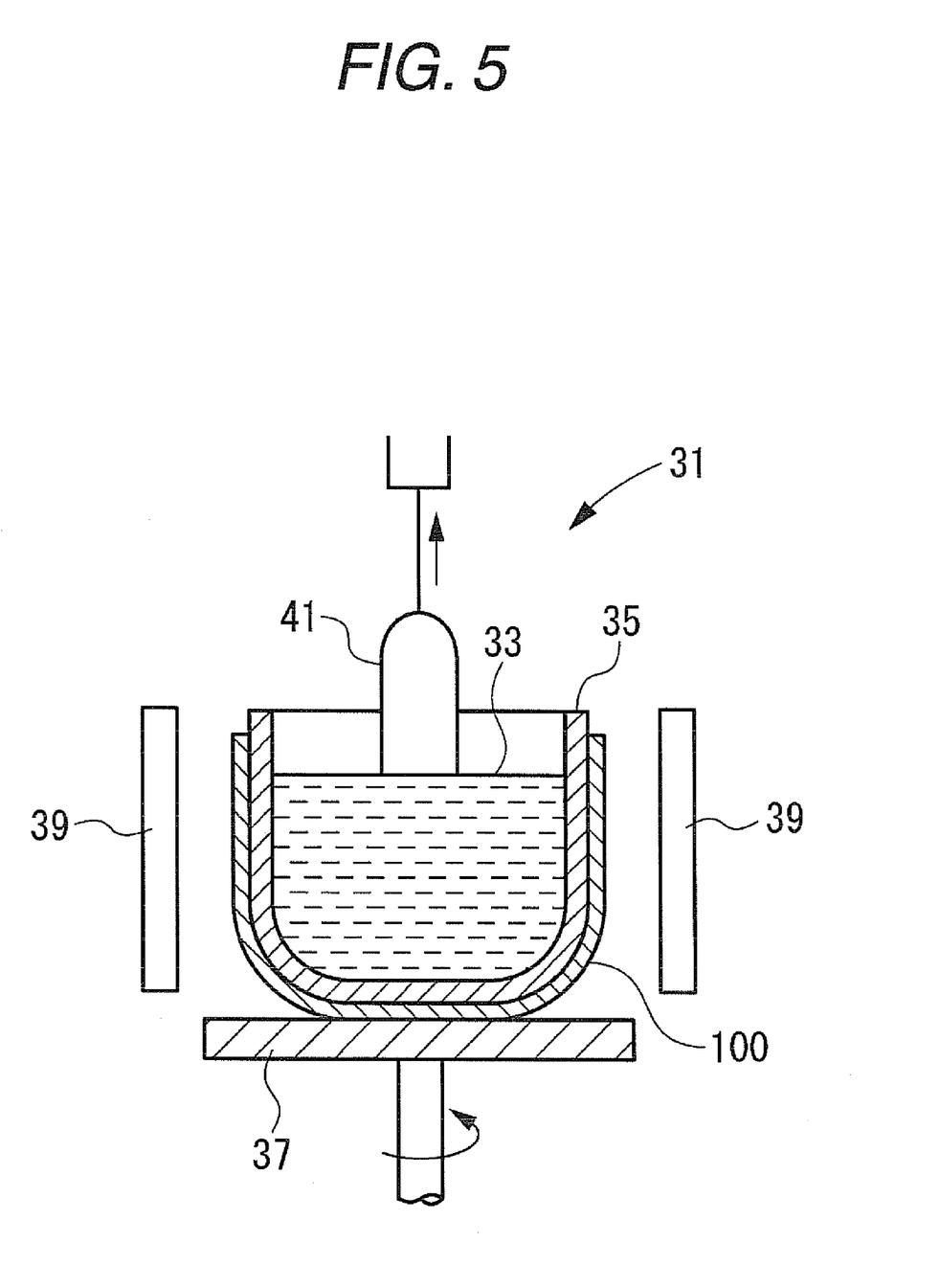
FIG. 5 is a cross-sectional view showing a silicon single crystal pulling-up apparatus using a crucible holding member according to an embodiment of the present invention.

Then, as an example of use of the crucible holding member according to this embodiment, an example in which the crucible holding member is applied to a silicon single crystal pulling-up apparatus will be described using FIG. 5. FIG. 5 is a cross-sectional view showing a silicon single crystal pulling-up apparatus using the crucible holding member according to the embodiment.

The silicon single crystal pulling-up apparatus 31 is equipped with a quartz crucible 35 for containing a silicon melt 33 and the closed-end basket-like crucible holding member 100 for holding an outer peripheral surface of the quartz crucible 35 in such a state that it is surrounded from the outside. These are placed on a support 37. A heater 39 is arranged around the periphery of the crucible holding member 100, and an ingot 41 is gradually pulled up while heating the silicon melt 33 through the quartz crucible 35 and the crucible holding member 100 with the heater 39, thereby preparing a silicon single crystal.

As described above, even when force to expand in the circumferential direction is applied, the crucible holding member 100 used herein can follow up the expansion. Accordingly, the occurrence of cracks, an outflow of the non-coagulated melt which accompanies the occurrence of the cracks, and the like can be suppressed, thus being able to improve reliability.

A load caused by the silicon melt 33 is little applied to an upper side of the crucible holding member 100 at which coagulation of the silicon melt 33 first occurs when the silicon single crystal pulling-up apparatus 31 is cooled. When the silicon melt coagulates in the initiation of pulling-up, the upper side directly receives volume expansion of the silicon melt 33, so that it is preferred that the angle of inclination θ is decreased in order to decrease the rigidity. On the other hand, a load caused by the silicon melt 33 is largely applied to a lower portion side. However, even when the silicon melt coagulates in the initiation of pulling-up, the lower portion side is hard to directly receive the volume expansion of the silicon melt 33, because the bottom portion of the quartz crucible is rounded. It is therefore preferred that the angle of inclination θ is increased so as to increase the rigidity.

In the case where the angle of inclination θ is decreased, even when the expansion of the silicon melt 33 occurs to extend in a lateral direction (in the circumferential direction), it is possible to easily follow the extension in the lateral direction, because the degree of shrinkage in a longitudinal direction (in a height direction) to the extension in the lateral direction is small. However, in the case where the angle of inclination θ is increased, even when the expansion of the silicon melt 33 occurs to extend in the lateral direction, it is impossible to easily follow the extension in the lateral direction, resulting in the application of strong force to the respective strands, because the degree of shrinkage in the longitudinal direction to the extension in the lateral direction increases. Accordingly, the first or second strands are broken, or the longitudinal strands become easy to buckle.

If the silicon single crystal pulling-up apparatus 31 is a large size which can produce a large-diameter ingot, it is preferred that the crucible holding member 100 has low thermal conductivity in an up and down direction so as to give such a temperature gradient that the temperature of an upper portion becomes high and that of a lower portion becomes low in the silicon melt 33. If the silicon single crystal pulling-up apparatus 31 has a large size, the time taken for pulling up becomes relatively long, resulting in containing the silicon melt 33 in the quartz crucible 35 for a long period of time. If the silicon melt 33 is placed in the quartz crucible 35 for a long period of time, the silicon melt 33 is liable to be contaminated with oxygen from the quartz crucible 35. However, the contamination with oxygen can be prevented by inhibiting convection of the silicon melt 33 as much as possible.

The carbon fibers which form the strands having low thermal conductivity include, for example, common carbonaceous carbon fibers (to graphitic carbon fibers) and the like.

In addition, if the mesh size of the crucible holding member 100 is large, the quartz crucible 35 inserted in the crucible holding member 100 is softened and cut into meshes to cause difficulty in removal in some cases. In order to prevent this, it is advantageous to provide a carbonaceous or graphitic sheet such as an expanded graphite sheet or a carbon fiber papermaking sheet to intervene between the crucible holding member 100 and the quartz crucible 35.

Further, if such a carbonaceous or graphitic sheet is provided to intervene, the quartz crucible 35 and the crucible holding member 100 do not directly contact with each other, so that the deterioration of the crucible holding member 100 caused by a reaction with the quartz crucible 35 is hard to occur. Accordingly, there is a merit that the crucible holding member can be repeatedly used by exchanging only the carbonaceous or graphitic sheet.

In the above-described example of use, there is described the example in which the crucible holding member has been applied to the quartz crucible holding member of the silicon single crystal pulling-up apparatus. However, the use of the crucible holding member according to the invention is not limited thereto, and it can be applied to any use, as long as it is, for example, a member for holding a container for containing a melt of metal, glass, silicon or the like. In particular, if it is applied to a member for holding a container different therefrom in a thermal expansion coefficient in the inside thereof, the above-described advantages are obtained.

Figure 6A:
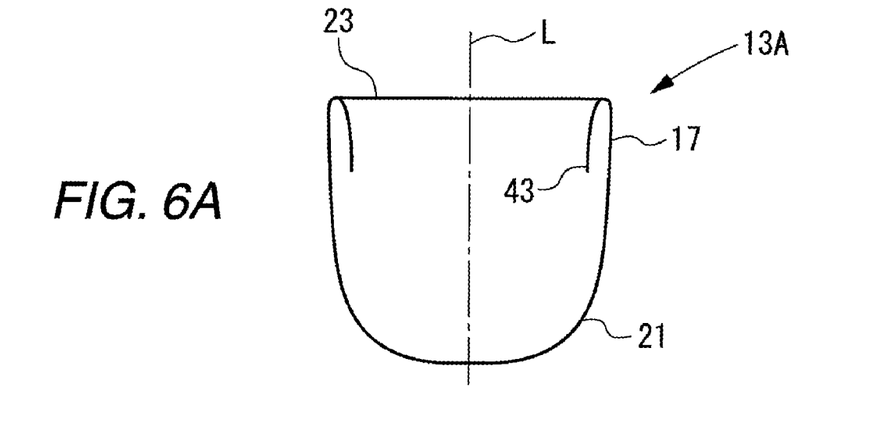
FIGS. 6A to 6C are cross-sectional views showing modified examples of two-layer structures of a mesh body.
Figure 6B:
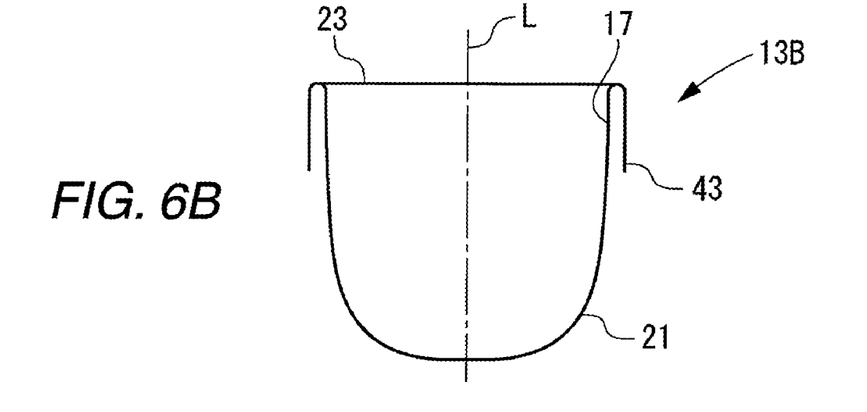
Figure 6C:
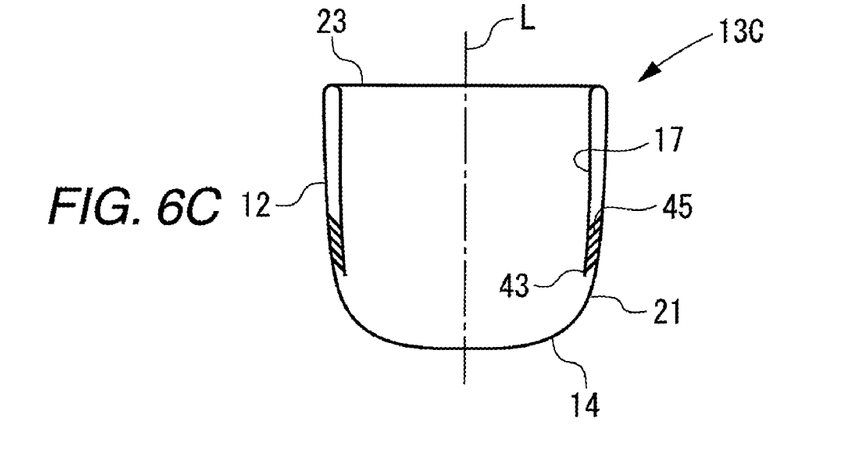
Figure 7:
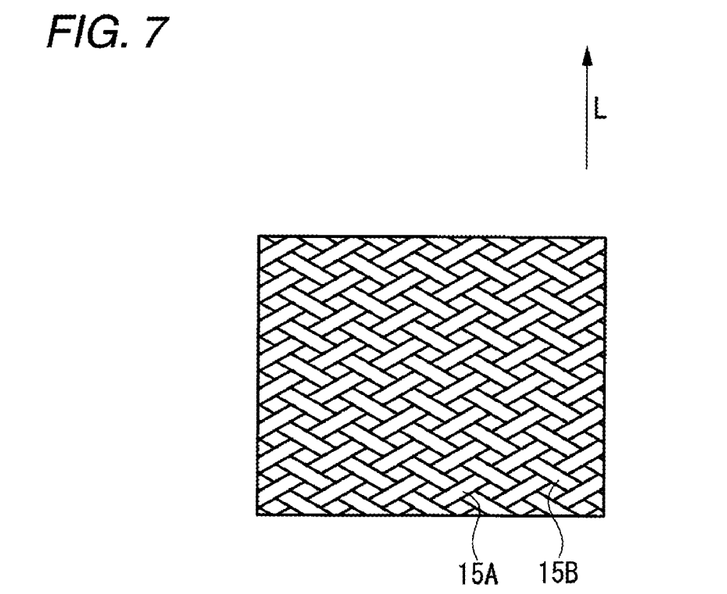
FIG. 7 is an enlarged front view showing a part of a modified example of a weave structure having no longitudinal strands.
Figure 8:
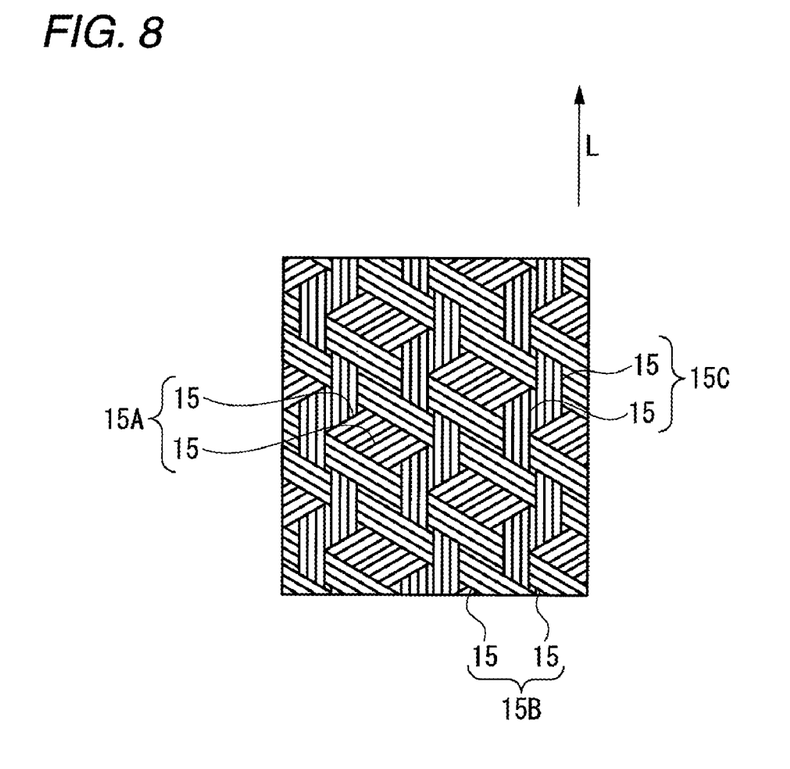
FIG. 8 is an enlarged front view showing a part of a modified example of a weave structure having a plurality of diagonal strands.

FIGS. 6A to 6C are cross-sectional views showing modified examples of two-layer structures of the mesh body, FIG. 7 is an enlarged front view showing a part of a modified example of a weave structure having no longitudinal strands, and FIG. 8 is an enlarged front view showing a part of a modified example of a weave structure having a plurality of diagonal strands.

The invention is not limited to the above-mentioned embodiments, and can be performed in various configurations within the range not departing from the scope thereof. For example, as shown in FIG. 6A or 6B, the above-described mesh body 13 may be configured by forming a closed-end cylindrical body 13A or 13B in which at least an end portion 43 of one side 17 in a direction of an axis line L is opened and the other side 21 is closed, and turning the end portion 43 inwardly as shown in FIG. 6A or outwardly as shown in FIG. 6B.

According to this mesh body 13A or 13B, the open end portion 43 of the mesh body 13A or 13B formed into a cylindrical shape is turned back, whereby an opening portion 23 comes to have a two-layer structure, resulting in an increase in strength of the opening portion, and in no occurrence of fraying due to a broken end of the strand positioned at the opening portion in the case of a monolayer structure.

Further, the above-described mesh body 13 may be a mesh body 13C in which, as shown in FIG. 6C, the end portion 43 of the one side 17 turned inwardly or outwardly (inwardly in the drawing) is adhered to the other side 21 with an adhesive. According to this mesh body 13C, the open end portion 43 of the one side 17 is turned back to the vicinity of a bottom portion 14, and adhered thereto with the adhesive. Accordingly, a body portion 12 from the opening portion 23 except the bottom portion 14 comes to have the two-layer structure. Although the lower bottom portion 14 has a single-layer structure, strength is required for the body portion 12 in which vigorous thermal expansion occurs. Therefore, even such a shape may be sufficient. This causes high strength against tension acting in the circumferential direction and also suppresses the fraying of the opening portion 23.

Furthermore, in the above-described embodiments, the mesh body 13 formed by a triaxial weave is shown. However, the mesh body according to the invention is not limited to one obtained by the triaxial weave, and may have a configuration having only strands 15A and 15B aligned diagonally with respect to an axis line L as shown in FIG. 7. That is, the mesh body has no strand in the circumferential direction in a plane perpendicular to the axis line L (in the lateral direction in FIG. 7). Stress is not concentrated to some of the strands thereby even when such force as to expand in the circumferential direction acts, because no strand in the circumferential direction is present, resulting in no occurrence of breakage of the strands.

Further, as shown in FIG. 8, it may have a configuration in which two or more strands 15 and 15 are aligned diagonally.

The embodiment of the present invention provides a crucible holding member which is able to improve strength, which is stable in shape even when strong tension acts in the circumferential direction, and moreover, in which a decrease in strength of an opening portion due to the fraying is not likely to occur.

(1) According to one embodiment of the present invention, there is provided a crucible holding member including: a hollow mesh body formed by weaving a plurality of strands to be aligned diagonally with respect to an axis line of the mesh body, each of the strands including a plurality of carbon fibers, the mesh body including a two-layer opening portion in which one side of the mesh body is turned inwardly or outwardly at a circumferential portion thereof to overlap the other side of the mesh body; and a matrix filled in the interstices between the carbon fibers of the mesh body.

According to this crucible holding member, the strands are diagonally woven, so that it is stable in shape even when strong tension acts in the circumferential direction. The mesh body has a two-layer structure on the other side on which one side is overlapped by turning, so that the strength is improved compared to the monolayer structure, and the fraying of the opening portion is reduced or prevented.

(2) In the crucible holding member of (1), the mesh body may include: a plurality of first strands aligned in a first direction inclined with respect to the axis line; and a plurality of second strands aligned in a second direction inclined with respect to the axis line, and the first direction is opposite to the second direction with respect to the axis line.

According to this crucible holding member, rigidity in the circumferential direction is low, so that even when such force that expands in the circumferential direction acts on the crucible holding member, the mesh body can be enlarged in the circumferential direction by distortion of rhomboid-shaped lattices formed by the first strands and the second strand, thereby being able to absorb expansion in the circumferential direction.

(3) In the crucible holding member of (1) or (2), the mesh body may further includes a plurality of longitudinal strands aligned along the axis line.

According to this crucible holding member, the load of crucible acting in a vertical direction agrees with an extending direction of the longitudinal strands, so that the withstand load in the vertical direction of the mesh body (That is, the strength for carrying the crucible) increases.

(4) In the crucible holding member of any one of (1) to (3), the mesh body may be formed into a spheroidal shape and inwardly folded at the circumferential portion thereof at a half of a major axis of the spheroid shape so that one side of the mesh body overlaps the other side of the mesh body.

According to this crucible holding member, a bowl-shaped mesh body having an endless two-layer structure can be prepared simply, and moreover, with a high degree of accuracy, compared to the case where two mesh bodies separately prepared are overlapped each other. This makes it possible to increase the strength of the whole mesh body, and particularly, to form the high-strength opening portion which causes less or no fraying.

(5) In the crucible holding member of any one of (1) to (4), the mesh body may be formed into a cylindrical shape in which at least an end portion of one side in a direction of the axis line is opened, and the end portion is turned inwardly or outwardly to form the two-layer opening portion.

According to this crucible holding member, the open end portion of the mesh body formed into the cylindrical shape is turned back, so that the opening portion comes to have the two-layer structure, resulting in an increase in strength of the opening portion, and in no occurrence of fraying due to a broken end of the strand positioned at the opening portion in the case of a monolayer structure.

(6) In the crucible holding member of (5), the end portion of the one side turned inwardly or outwardly may be adhered to the other side of the mesh body with an adhesive.

According to this crucible holding member, for example, when the mesh body is a closed-end cylindrical body in which one side is opened and the other side is closed, the open end portion of the one side is turned back to the vicinity of the bottom portion, and adhered thereto with the adhesive. That is, the mesh body having the two-layer structure from the opening portion to a side portion except the bottom portion is obtained. This causes high strength against tension acting in the circumferential direction and also prevents the fraying of the opening portion.

(7) According to another embodiment of the present invention, there is provided a method for producing a crucible holding member including: forming a mesh body having a hollow spheroidal shape with a major axis by weaving a plurality of strands to be aligned diagonally with respect to the major axis, each of the strands including a plurality of carbon fibers; folding the mesh body inwardly at a circumferential portion thereof at a half of the major axis so that one side of the mesh body overlaps on the other side thereof, and filling a matrix in the interstices between the carbon fibers of the mesh body.

According to this method for producing a crucible holding member, a pair of bowl-shaped mesh bodies formed into the same shape symmetrically with respect to a minor axis are overlapped each other inside and outside to form the bowl-shaped mesh body having the endless two-layer structure.

(8) In the method for producing a crucible holding member of (7), the strands may be woven on an outer surface of a core to form the mesh body having the spheroid shape, and then, the core is removed to form a hollow of the mesh body.

According to this method for producing a crucible holding member, the strands are woven on an outer circumferential surface of the spheroid-shaped core formed, for example, by an easily destructible member for removal thereof, in such a manner that they are overlaid thereon from one end side of the major axis, and the mesh body having a shape similar to that of the core is formed, covering the core. Then, the core is destructed to such a size as to be taken out, and removed, for example, through a nonwoven portion or meshes, thereby becoming possible to prepare the spheroid-shaped mesh body having a hollow space easily and with a high degree of accuracy.

According to the above-described crucible holding member, one side of a hollow mesh body formed by diagonally weaving strands including carbon fibers is turned inwardly or outwardly at a circumferential portion to overlap it on the other side, thereby forming a two-layer opening portion. Accordingly, the strength can be easily improved, compared to the monolayer structure. As a result, it is stable in shape even when strong tension acts in the circumferential direction, and moreover, the fraying of the opening portion can be reduced or prevented.

According to the above-described method for producing a crucible holding member, strands are diagonally woven to form a hollow mesh body, and the mesh body is inwardly folded in half to overlap one side of the mesh body on the other side thereof. Accordingly, the crucible holding member of the endless two-layer structure which is high in strength and stable in shape to tension in the circumferential direction and moreover in which the fraying of the opening portion is prevented can be prepared easily and with a high degree of accuracy, compared to the case where two mesh bodies are prepared and overlapped each other.

EXAMPLES

Examples of more specific structures of crucible holding members according to the present invention and production methods thereof will be described with reference to the following examples. The present invention is not limited to these production methods, and any method may be used, as long as the crucible holding members according to the present invention can be obtained.

Example 1

First, a core for producing a mesh body was prepared. The core was produced as a spheroidal shape (1,200 mm diameter and 450 mm high) whose both ends in an axis line direction were formed into a bowl shape, which was obtained by forming an elastic sheet material into a bag shape, and sealing compressed air in the inside thereof.

Then, using 140 ribbon-like strands for each of the first, second and longitudinal strands, a triaxil weave mesh body was formed on an outer peripheral surface of the core. Each of the strands includes 24,000 carbon filaments (manufactured by Toray Industries, Inc., trade name: T800S24K). In a state where the outer peripheral surface of the core is almost covered therewith, the core was destructed, and the core destructed (elastic sheet material) was removed through an uncovered opening. The triaxial weave was completed while the opening of the uncovered portion was closed, and ends of the strands were subjected to adhesion treatment to obtain a spheroid-shaped mesh body whose inside was hollow.

Next, an upper half of the mesh body was turned inwardly to overlap it on a lower half thereof to form a basket shape having an endless two-layer structure.

The mesh body produced above was impregnated with a phenol resin forming material (manufactured by Asahi Organic Chemicals Industry Co., Ltd., KL-4000) as a matrix precursor, then, elevated in temperature to 200° C. at a rate of temperature increase of 2° C./hour in a drier equipped with an exhaust system, and allowed to stand as such for 3 hours to cure it.

Then, after carbonization was performed up to 1,000° C. at 10° C./hour under a nonoxidative atmosphere, high-temperature treatment was performed up to 2,000° C., and highly-purifying treatment was further performed with chlorine gas for 4 hours to obtain a crucible holding member having a diameter of about 1,230 mm and a height of about 550 mm.

Comparative Example 1

A forming die for producing a mesh body was prepared. Six side plates made of graphite (600 mm wide, 850 mm long and 200 mm thick) were prepared. Corners of the respective side plates were planed to an angle of 60°, and the side plates are bonded to one another by using an adhesive for graphite material (COPNA resin) to form a hollow hexagonal cylinder. Then, two graphite bottom plates (736 mm wide, 1,700 mm long and 200 mm thick) were prepared, and bonded to end faces of the hollow hexagonal cylinder by using an adhesive for graphite material (COPNA resin) to form a crude forming die. An outer circumferential surface of a body portion of this crude forming die was ground to a cylindrical shape and outer circumferential surfaces of bottom portions to a bowl shape to produce a forming die (1,400 mm diameter and 600 mm high). The forming die was covered with a plain weave cloth formed using the same strands as in Example 1. In this case, the strands were arranged so as to be aligned in a longitudinal direction and a circumferential direction. Further, impregnation with the phenol resin forming material, curing, carbonization and highly-purifying treatment were performed in the same manner as in Example 1. A crucible holding member thus obtained has no strands aligned diagonally which exist in Example 1 described above, and has strands aligned laterally (hereinafter referred to as lateral strands).

Test Example 1

A state of stress distribution at the time when strain was applied in both directions of a body portion of the crucible holding member having a triaxial weave endless two-layer structure obtained as described in Example 1 was modeled with Solid Works 2007 (registered trade mark) manufactured by Solid Works Corporation, and static analysis was performed with a Cosmos Works (registered trade mark) manufactured by Structural Research & Analysis Corporation. Taking the width of the strand as 10 mm, the thickness thereof as 2 mm, and an overlapped portion of the triaxial weave as being fixed with a 3 mm diameter pin, a minimum element unit of the triaxial weave was modeled. The strain amount in the lateral direction was 0.3%, the elastic modulus of the strand was 400 GPa, and Poisson's ratio was 0.2.

Figure 9:
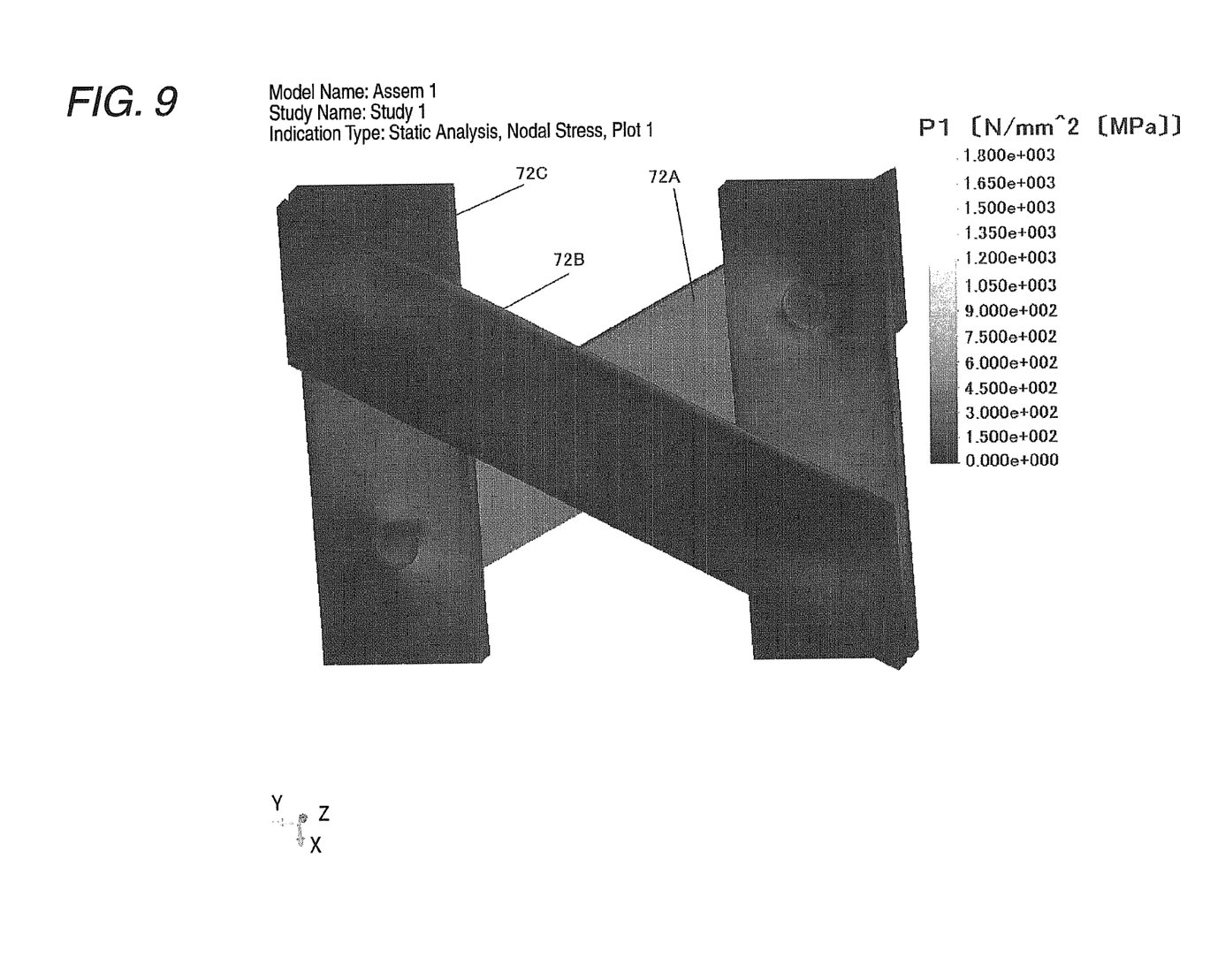
FIG. 9 is a view showing the analysis results of stress distribution of a crucible holding member according to Example 1.

The results of stress analyzed under the above-mentioned conditions are shown in FIG. 9. It is found that the strain applied in the lateral direction is also transmitted to the longitudinal strands 72C through the first strands 72A and the second strands 72B aligned diagonally, resulting in uniform application of the stress as a whole.

Test Example 2

Also, for a state of stress distribution at the time when strain was applied in a circumferential direction of a body portion of the crucible holding member including the plain weave mesh body of the longitudinal strands (in the height direction) and the lateral strands (in the circumferential direction), which was obtained as described in Comparative Example 1, static analysis was performed in the same manner as in Test Example 1. Taking the width of the strand as 10 mm, the thickness thereof as 2 mm, and an overlapped portion of the triaxial weave as being fixed with a 3 mm diameter pin, a minimum element unit of the triaxial weave was modeled. The strain amount in the lateral direction was 0.3%, the elastic modulus of the strand was 400 GPa, and Poisson's ratio was 0.2.

Figure 10:
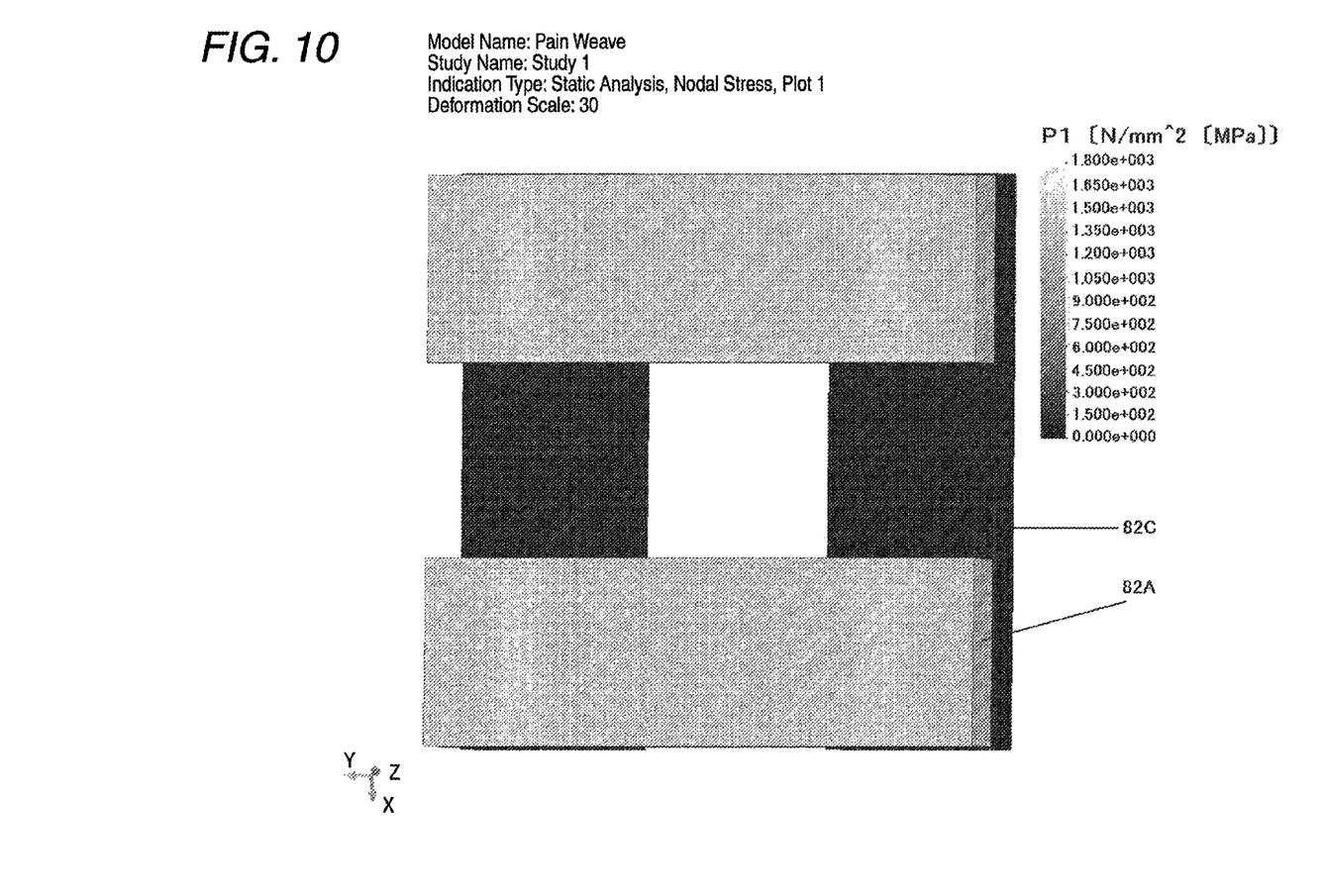
FIG. 10 is a view showing the analysis results of stress distribution of a crucible holding member according to Comparative Example 1.

The results of stress analyzed under the above-mentioned conditions are shown in FIG. 10. It is found that the strain applied in the lateral direction is applied to only the lateral strands 82A and scarcely transmitted to the longitudinal strands 82C. It is therefore conceivable that large stress (tension) is applied to the lateral strands 82A, which causes easy breakage.

Obviously, numerous modifications and variations of the present invention are possible in light of the above teachings. It is therefore to be understood that within the scope of the appended claims, the invention may be practiced otherwise than as specifically described herein.

What is claimed is:
1. A crucible holding member comprising:
   a mesh body having an axis direction and comprising:
      a hollow;
      an opening inside which the hollow is provided, the opening facing toward one end of the axis direction; and
      a plurality of strands comprising a plurality of carbon fibers and woven diagonally with respect to the axis direction to provide the hollow and the opening, the plurality of strands being folded inwardly or outwardly at an edge of the opening, thereby providing a two-layered portion along the edge of the opening; and
   a matrix filled between the plurality of carbon fibers of the mesh body.
2. The crucible holding member according to claim 1, wherein the plurality of strands comprise,
   a plurality of first strands aligned in a first direction inclined with respect to the axis direction, and
   a plurality of second strands aligned in a second direction inclined with respect to the axis direction so that the plurality of first strands and the plurality of second strands are substantially symmetrical with respect to the axis direction.
3. The crucible holding member according to claim 1, wherein the plurality of strands further comprise a plurality of longitudinal strands aligned along the axis direction.

4. The crucible holding member according to claim 1,
wherein the crucible holding member is produced by providing a mesh body precursor in a spheroidal shape having a circumferential portion orthogonal to the axis direction to define a first semispherical portion and a second semispherical portion and by folding the first semispherical portion into the second semispherical portion at the circumferential portion.

5. The crucible holding member according to claim 1,
wherein the crucible holding member is produced by providing a mesh body precursor in a cylindrical shape having at least one end opening portion facing toward one end of the axis direction and by turning the at least one end opening portion inwardly or outwardly in the axis direction.

6. The crucible holding member according to claim 5,
wherein the at least one end opening portion turned inwardly or outwardly is adhered to the mesh body with an adhesive.

7. A method for producing a crucible holding member comprising:
providing a mesh body precursor having an axis direction and comprising:
a spheroidal shape having a major axis along the axis direction, a circumferential portion orthogonal to the major axis to define a first semispherical portion and a second semispherical portion, and a hollow provided inside the spheroidal shape; and
a plurality of strands comprising a plurality of carbon fibers and woven diagonally with respect to the axis direction to form the spheroidal shape;
folding the first semispherical portion into the second semispherical portion at the circumferential portion to form an opening of a mesh body, the opening having an edge along which a two-layered portion is provided; and
filling a matrix between the carbon fibers.

8. The method according to claim 7,
wherein providing the mesh body precursor comprises weaving the plurality of strands on an outer surface of a core to form the mesh body precursor having the spheroidal shape and removing the core to form the hollow inside the mesh body precursor.

9. The crucible holding member according to claim 2,
wherein the plurality of strands further comprise a plurality of longitudinal strands aligned along the axis direction.

10. The crucible holding member according to claim 2,
wherein the crucible holding member is produced by providing a mesh body precursor in a spheroidal shape having a circumferential portion orthogonal to the axis direction to define a first semispherical portion and a second semispherical portion and by folding the first semispherical portion into the second semispherical portion at the circumferential portion.

11. The crucible holding member according to claim 3,
wherein the crucible holding member is produced by providing a mesh body precursor in a spheroidal shape having a circumferential portion orthogonal to the axis direction to define a first semispherical portion and a second semispherical portion and by folding the first semispherical portion into the second semispherical portion at the circumferential portion.

12. The crucible holding member according to claim 2,
wherein the crucible holding member is produced by providing a mesh body precursor in a cylindrical shape having at least one end opening portion facing toward one end of the axis direction and by turning the at least one end opening portion inwardly or outwardly in the axis direction.

13. The crucible holding member according to claim 3,
wherein the crucible holding member is produced by providing a mesh body precursor in a cylindrical shape having at least one end opening portion facing toward one end of the axis direction and by turning the at least one end opening portion inwardly or outwardly in the axis direction.

14. The crucible holding member according to claim 4,
wherein the crucible holding member is produced by providing a mesh body precursor in a cylindrical shape having at least one end opening portion facing toward one end of the axis direction and by turning the at least one end opening portion inwardly or outwardly in the axis direction.

* * * * *